United States Patent [19]

Hamilton et al.

[11] Patent Number: 5,692,558
[45] Date of Patent: Dec. 2, 1997

[54] MICROCHANNEL COOLING USING AVIATION FUELS FOR AIRBORNE ELECTRONICS

[75] Inventors: Robin E. Hamilton, Millersville; Paul G. Kennedy, Grasonville, both of Md.

[73] Assignee: Northrop Grumman Corporation, Los Angeles, Calif.

[21] Appl. No.: 681,343

[22] Filed: Jul. 22, 1996

[51] Int. Cl.$^6$ ............................................. F28F 7/00
[52] U.S. Cl. ............................ 165/80.4; 165/104.33; 257/714; 361/699
[58] Field of Search ............... 165/104.33, 80.4, 165/80.3; 361/699, 697, 700, 696; 257/712, 713, 714

[56] References Cited

U.S. PATENT DOCUMENTS

| | | | |
|---|---|---|---|
| 3,361,195 | 1/1968 | Meyerhoff et al. | 165/80.4 |
| 3,999,400 | 12/1976 | Gray | 62/115 |
| 4,635,709 | 1/1987 | Altoz | 165/104.33 X |
| 4,644,385 | 2/1987 | Nakanishi et al. | 165/80.4 X |
| 5,028,989 | 7/1991 | Naganuma et al. | 165/80.4 X |
| 5,126,829 | 6/1992 | Daikoku et al. | 257/714 X |
| 5,241,450 | 8/1993 | Bernhardt et al. | 257/712 X |
| 5,349,498 | 9/1994 | Tanzer et al. | 165/80.4 X |
| 5,365,402 | 11/1994 | Hatada et al. | 165/80.4 X |

FOREIGN PATENT DOCUMENTS

| | | | |
|---|---|---|---|
| 4028257 | 1/1992 | Japan | 257/714 |
| 4256346 | 9/1992 | Japan | 257/714 |

OTHER PUBLICATIONS

A.H. Johnson, Integrally Groove Semiconductor Chip and Heat Sink, Oct. 1971, p. 1425.

*Primary Examiner*—John Rivell
*Assistant Examiner*—Christopher Atkinson
*Attorney, Agent, or Firm*—Walter G. Sutcliff

[57] ABSTRACT

Aviation fuel is used as the coolant for a microchannel heat sink for airborne electronics. The use of preexisting aviation fuel as a coolant medium eliminates the weight, size and expense of a separate liquid system dedicated solely to electronics cooling. The heat sink is comprised of a body of material having high thermal conductivity and in which are formed a set of parallel closed-ended microchannels on the order of 0.001 in. by 0.004 in. separated by a distance of 0.001 in.

20 Claims, 2 Drawing Sheets

MICROCHANNEL COOLING USING AVIATION FUELS FOR AIRBORNE ELECTRONICS

CROSS REFERENCE TO RELATED APPLICATION

This application is related to copending application Ser. No. 08/681,344 entitled, "Microchannel Cooling of High Power Semiconductor Devices", Robin E. Hamilton et al, filed on Jul. 22, 1996. This application is assigned to the assignee of the present invention and is incorporated herein by reference.

BACKGROUND OF THE INVENTION

1. Field of the Invention

This invention relates to the coolant medium utilized in conjunction with heat sinks for electronic devices and more particularly to a coolant medium utilized in connection with microchannel heat sinks for relatively high power airborne electronic devices.

2. Description of the Prior Art

The greatest limitation in the design of low cost, light weight, high power airborne electronics is the reliable cooling of densely packaged components. Current state of the art electronic packaging typically utilizes redundant parts and excess substrate areas which increases system cost, size and weight. All of this results from the inherent limitations in the cooling schemes employed. For example, in solid state transmitters, RF transistors are regularly designed to operate below their power output capability and are spaced relatively far apart from one another in order to provide cooling which complies with military standards. Conventional heat sinks utilizing typical coolants such as ethylene glycol water, are not adequate for practical RF circuit densities.

SUMMARY

Accordingly, it is a primary object of the present invention to provide an improvement in the extraction of heat from electronic devices.

It is another object of the invention to provide an improvement in the cooling of semiconductor devices.

It is a further object of the invention to provide an improvement in the cooling of power semiconductor devices which are utilized in airborne electronics equipment.

Briefly, the foregoing objects are achieved by convection cooling apparatus for airborne electronics systems devices which include heat generating devices and a heat sink therefor, and wherein the heat sink comprises a body of material having relatively high thermal conductivity and in which is formed a plurality of close-ended liquid coolant conduction microchannels which are located as close as possible to the heat source and in which the coolant medium comprises the aviation fuel used to power the aircraft.

Further scope of applicability of the present invention will become apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
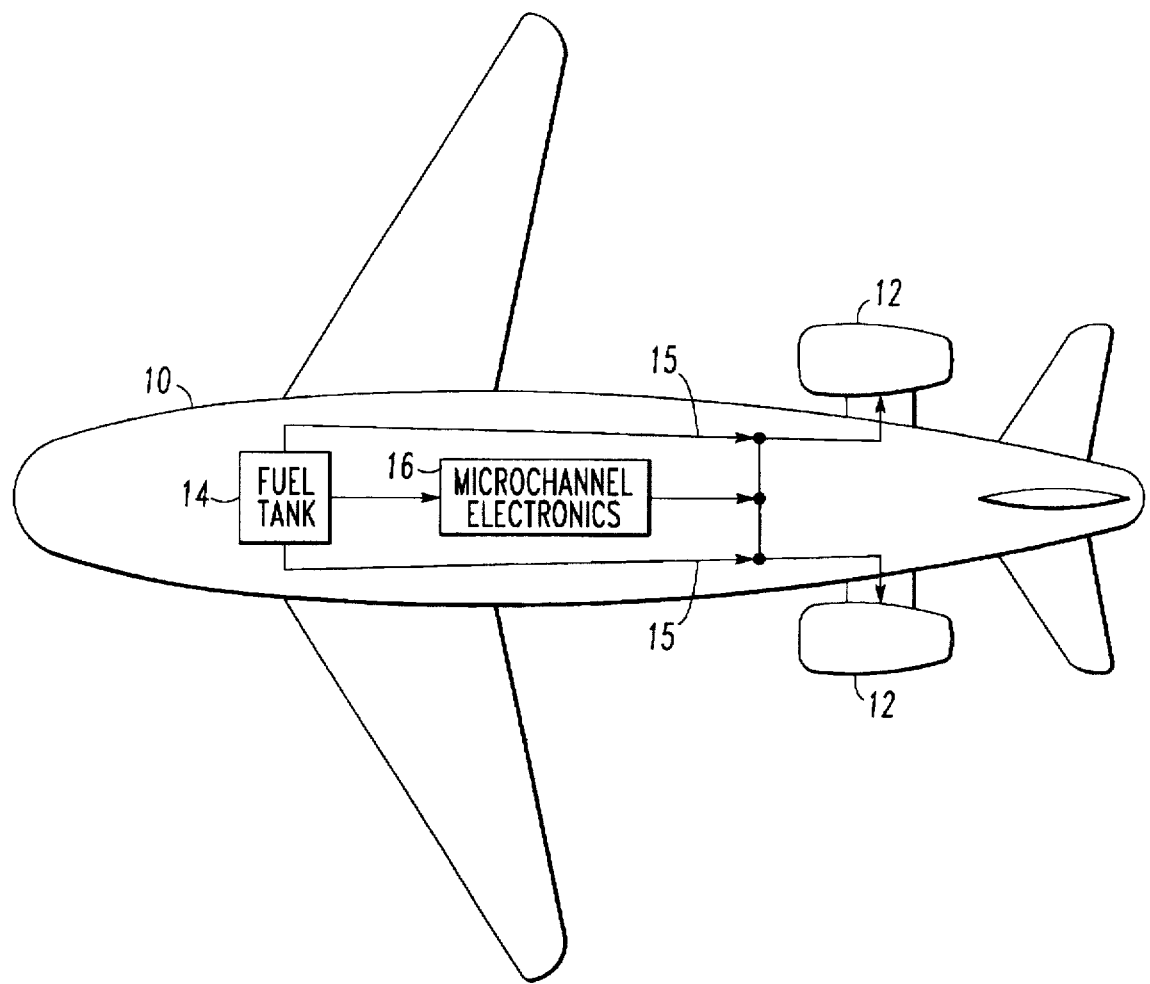
FIG. 1 is a diagram generally illustrative of the inventive concept of this invention.
Figure 2:
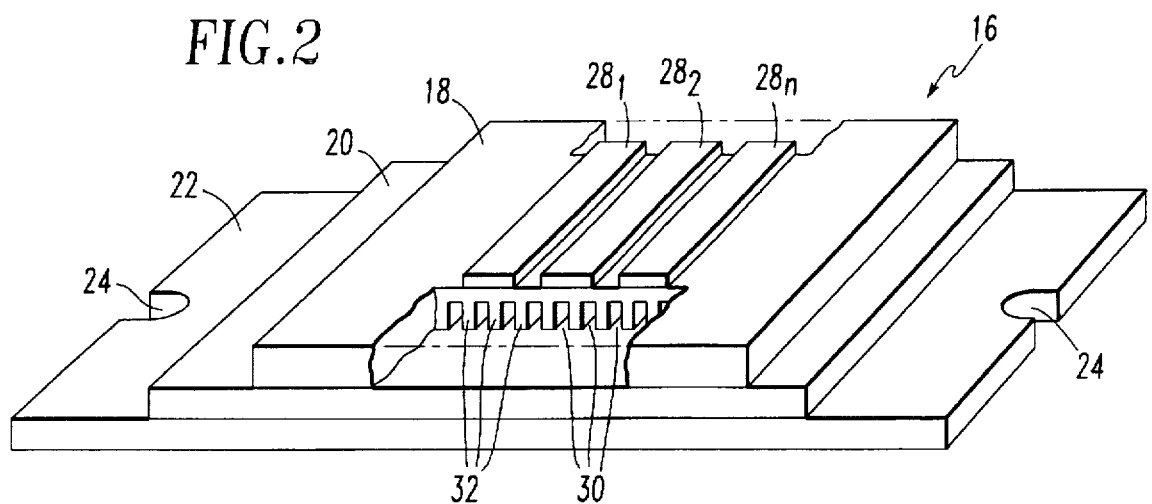
FIG. 2 is a perspective view partially cut away, of a microchannel heat sink in accordance with this invention.

Referring now to the figures and more particularly to FIG. 1, shown thereat is an aircraft identified by reference numeral 10 which includes one or more power plants 12 which may be, for example, jet engines fueled from one more fuel tanks 14. In this invention, aviation fuel from fuel tank 14 is used as the coolant medium for extracting heat from electronic circuitry 16 located on board the aircraft. The electronic circuitry 16 is cooled by a microchannel forced convection heat sink configuration which is shown in FIG. 2 and identified by reference numeral 18. The heat sink 18 is eutectically bonded to a ceramic substrate 20 which in turn is braised to a metal carrier number 22 referred to as a flange. The flange 22 is additionally shown including a pair of open-ended U-shaped slots 24 which are used for attachment to a ground plane 26 shown in FIG. 3.

The heat sink 18 is formed from solid material, e.g. metal (aluminum) or semiconductor (silicon/silicon carbide) having a high thermal conductivity and on which a plurality of semiconductor devices $28_1$, $28_2$, $28_n$ are located or integrated therewith. The heat sink 18 further includes a plurality of mutually parallel close-ended microchannels 30 of rectangular cross section formed in the block of material from which the heat sink 18 is formed.

Each microchannel 30 comprises an elongated linear groove ranging in width between 0.001 in. and 0.004 In., a depth ranging between 0.004 in. and 0.01 in. with a spacing ranging between 0.001 and 0.003 in.

The rectangular spacing sections 32 act as fins. As shown in FIG. 2 where the semiconductor device 28 is thermally in contact with the top of the heat sink 18, the heat generated in the devices 28 is transferred through the solid upper portion of the heat sink 18 and the fins 32 by conduction and is thereafter transferred to a coolant, not shown, flowing through the microchannels 30.

Figure 3:
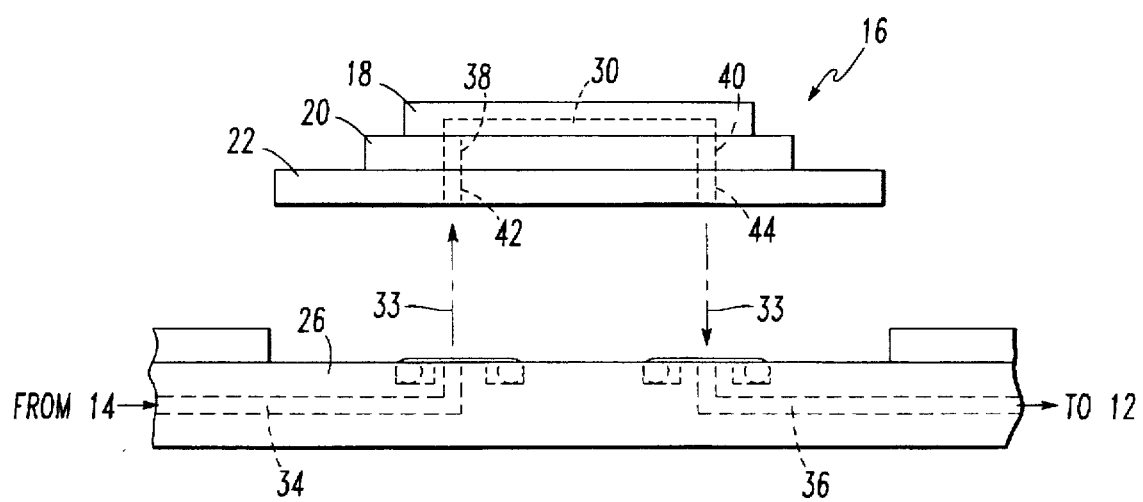
FIG. 3 is an exploded view of the embodiment shown in FIG. 2 mounted on a ground plane.

As shown in FIG. 3, coolant 33 which comprises the aviation fuel for powering the engines 12, is coupled to and from the microchannels 30 by means of an input duct 34 and output duct 36 formed in the ground plane member 26 upon which the semiconductor package 16 is mounted. The input duct 34 is coupled to the fuel tank 14 (FIG. 1), while the output duct 36 is coupled back to the fuel feedline(s) 15 coupled to the engines 12. Also as shown in FIG. 3, the fuel coolant 33 is fed to and from the microchannels through pairs of manifolds 38, 40 and 42, 44 formed in the ceramic substrate 20 and the metal flange 22, respectively. With such a structure, conduction and thermal radiation are typically negligible compared to convection and the transfer of heat to the coolant.

For maximum effectiveness, the heat generating devices which comprise the semiconductor devices 28, are formed directly on the heat sink material, eliminating the thermal resistance of the joint between the device and the heat sink.

The microchannels 30 can be simply etched, for example, using standard photolithographic processes on the back side of a transistor chip. The ceramic substrate 20 acts to seal the bottom close-ended microchannels 30.

This packaging approach can be utilized with different components other than transistors and even with integrated circuits up to a wafer scale level of integration. It can also be used with various semiconductors forming the heat sink 18 such as silicon, silicon carbide as noted above, but also germanium and gallium arsenide. The ceramic substrate 20 is typically comprised of beryllium oxide and aluminum nitride but is not constrained thereto.

The small size of a 0.5 in.×0.5 in. microchannel heat sink 18 is ideal for direct cooling of hot components. The thermal efficiencies in large mass typical with traditional heat transfer from a device through a circuit board, to a heat exchanger, is now eliminated. A microchannel heat sink 18, such as shown in FIG. 2, is many times more efficient than conventional heat sinks and is due to the dimensions of the microchannels 30. The use of microchannels 30 enhances heat transfer in two ways. First, narrow channels can be closely spaced, giving a large number of fins 32 with a combined surface area much greater than the "footprint" of the heat sink 18 itself. Secondly, the small hydraulic diameters of the narrow passages 30 result in relatively high convective heat transfer coefficients. Since the thermal conductance of a heat sink is proportional to the product of the convective heat transfer coefficient in the surface area, small channels permit an increase in the maximum power density for a given operating temperature.

This superior performance makes aviation fuel, even with fluid conductivity and specific heat less than that of water, a desired medium 33 for high heat density coolant applications. For example, as outlined in Table I below, CHEVRON® 100LL aviation fuel used in a 0.5 in.×0.5 in. microchannel heat sink for dissipating 50 watts, outperforms a conventional water cooled heat sink.

over conventional cooling techniques, thus making aviation fuel a practical coolant. In this case, a predetermined volume of the fuel can be routed through the electronics circuitry 16 (FIG. 2) first as shown in FIG. 1, and which is then fed to the engine(s) 12. This approach would minimize plumbing and pumping requirements and would not require a heat exchanger. Alternatively, a secondary pumping system could supply coolant 33 to the electronics circuitry 16 and return the fuel via a heat exchanger, not shown, back to the fuel tank(s) 14. An aircraft with fuel tanks 14 integral with the wings can capitalize on the "free" heat exchanger provided by such a configuration, in that forced air flowing over the wing, fuel line and fuel tank combination would lower the temperature of the heated fuel returning from the electronics down to near ambient.

Microchannel cooling using aviation fuel is particularly suitable to remotely piloted vehicles (RPVs) since malfunction of coolant fuel lines 15 or electronic equipment 16 as may happen in a battle environment, would not present a safety hazard to aircraft personnel.

Thus what has been shown and described is the concept of utilizing aviation fuel as a coolant medium for use in connection with a heat sink for heat generating electronic devices where the heat sink includes a series of close-ended microchannel grooves which act as the cooling paths for the aviation fuel fed to and from the heat sink.

The invention being thus disclosed, it will be obvious that the same may be varied in many ways. Such variations are not to be regarded as a departure from the spirit and scope of the invention, and all such modifications that would be obvious to one skilled in the art are intended to be included within the scope of the following claims.

We claim:

1. A microchannel cooled heat sink for directly cooling a heat generating electronics device located in an aircraft, comprising:

a body of material having relatively high thermal conductivity;

TABLE I

| fluid | heat sink type | heat sink geometry | flow rate | Temp delta (fluid-fin) | Temp delta (fluid) |
| --- | --- | --- | --- | --- | --- |
| water | lanced-offset aluminum finstock | 0.5" × 0.5" base, 0.125" high fins. 0.006" thk fins. 12 fins/inch | 4.01 gm/sec | 38.8 deg C. | 3 deg C. |
| Chevron 100LL | lanced-offset aluminum finstock | 0.5" × 0.5" base 0.125" high fins. 0.006" thk fins 12 fins/inch | 7.49 gm/sec | 64.6 deg C. | 3 deg C. |
| Chevron 100LL | aluminum microchannel | 0.5" × 0.5" base 0.001" wide fins. 0.001" wide channels 0.010" tall fins | 0.90 gm/sec | 0.8 deg C. | 25 deg C. |

The fluid to fin temperatures Δ within the microchannel heat sink 18, is drastically reduced, while using even less flow rate. Similar performance can be achieved using jet fuel JP-5. Not unexpectedly, 100LL used in a conventional heat sink performs worse than water as shown in Table I.

The volume and flow rate of fuel needed for cooling will vary with electronics applications and/or aircraft. Typically, the required flow rate will equal or be less than the burn rate of the aircraft 10. Use of a microchannel heat sink 18 as shown in FIG. 2 permits the volume and flow rate of required coolant 33 to be reduced by orders of magnitude a plurality of close-ended convection cooling microchannels formed in said body for conducting a coolant medium therethrough;

the microchannels having walls operating as cooling fins and being sufficiently narrow to provide convective heat transfer coefficients and a fin density which are sufficiently high to enable high heat density cooling and, thereby, to enable effective device cooling with aviation fuel as the coolant; and a volume of aviation fuel being conducted as said coolant medium through said microchannels.

2. A heat sink according to claim 1 wherein said microchannels each have a width ranging between about 0.001 in. and about 0.004 in., a depth ranging between about 0.004 in. and about 0.01 in., and a spacing therebetween ranging between about 0.001 in. and about 0.005 in.

3. A heat sink according to claim 2 wherein said volume of aviation fuel comprises fuel fed from a fuel tank containing fuel powering said aircraft.

4. A heat sink according to claim 2 wherein said body comprises a metallic body.

5. A heat sink according to claim 2 wherein said body comprises a body of semiconductor material.

6. A heat sink according to claim 2 and additionally including at least one electronics device in thermal contact with said body.

7. A heat sink according to claim 6 wherein said at least one electronics device comprises a plurality of semiconductor devices.

8. A heat sink according to claim 7 wherein said body comprises a body of semiconductor material and wherein said plurality of semiconductor devices are integral with said body of semiconductor material.

9. A heat sink according to claim 2 wherein said body is located on support means including means for coupling said volume of aviation fuel to and from said microchannels.

10. A heat sink according to claim 9 wherein said support means includes a generally flat substrate contiguous with a mounting flange attachable to a ground plane, said substrate being located between said body and said mounting flange.

11. A method of extracting heat from an electronics device located in an aircraft, comprising the steps of:

thermally coupling said electronics device to a heat sink comprising a body of material having relatively high thermal conductivity, a plurality of microchannels having walls operating as cooling fins and being sufficiently narrow to provide convective heat transfer coefficients and a fin density which are sufficiently high to enable high heat density cooling and, thereby, to enable effective device cooling with aviation fuel as the coolant;

coupling a coolant comprising fuel used to power said aircraft to and from said microchannels so that the fuel flows through said microchannels to extract, by convection, heat generated by said electronics devices.

12. A method according to claim 11, wherein said microchannels each have a width ranging between about 0.001 in. and about 0.004 in., a depth ranging between about 0.004 in. and about 0.01 in., and a spacing therebetween ranging between about 0.001 in. and about 0.005 in.

13. A method according to claim 12 wherein said electronics device comprises a plurality of semiconductor devices.

14. A method according to claim 13 wherein said plurality of semiconductor devices are located on a top portion of said body and said plurality of microchannels are formed beneath said semiconductor devices in a bottom portion of said body.

15. A method according to claim 14 wherein said body comprises a metallic body.

16. A method according to claim 14 wherein said body comprises a body of semiconductor material.

17. A method according to claim 14 wherein said microchannels are arranged in mutual parallel relationship.

18. A method according to claim 11 and additionally including the step of locating said body on support means including means for coupling said volume of aviation fuel to and from said microchannels.

19. The method according to claim 18 wherein said support means includes a generally flat substrate contiguous with a mounting flange attachable to a ground plane, said substrate being located between said body and said mounting flange.

20. The heat sink of claim 3 and means for conveying coolant fuel from the fuel tank to an inlet to the microchannels, and means for conveying the coolant fuel from a microchannel outlet to at least one engine of the aircraft.

* * * * *